United States Patent [19]

Kim

[11] Patent Number: 5,917,339
[45] Date of Patent: Jun. 29, 1999

[54] MIXED VOLTAGE INPUT BUFFER

[75] Inventor: Min Hwahn Kim, Ichonshi, Rep. of Korea

[73] Assignee: Hyundai Elecronics Industries Co., Ltd., Rep. of Korea

[21] Appl. No.: 08/777,207

[22] Filed: Dec. 27, 1996

[30] Foreign Application Priority Data

Dec. 29, 1995 [KR] Rep. of Korea ........................ 95-64414

[51] Int. Cl.$^6$ ............................................. H03K 19/0185
[52] U.S. Cl. .................................. 326/68; 326/83; 326/58
[58] Field of Search .................................. 326/68, 70, 71, 326/57, 58, 80, 81, 63, 83

[56] References Cited

U.S. PATENT DOCUMENTS

| 5,276,364 | 1/1994 | Wellheuser . | |
|---|---|---|---|
| 5,424,659 | 6/1995 | Stephens et al. . | |
| 5,534,789 | 7/1996 | Ting | 326/81 |
| 5,559,996 | 9/1996 | Kujioka | 326/68 |
| 5,570,042 | 10/1996 | Ma | 326/63 |

FOREIGN PATENT DOCUMENTS 2248988  4/1992  United Kingdom ..................... 326/83

*Primary Examiner*—Jon Santamauro
*Assistant Examiner*—Don Phu Le
*Attorney, Agent, or Firm*—Blakely Sokoloff Taylor & Zafman

[57] ABSTRACT

In a mixed voltage input buffer for managing mixed voltages in a semiconductor device which uses various voltages, includes a transmission unit for inputting a given signal and transmitting the input signal according to an enable signal, and a voltage level conversion unit for inputting an output signal of the transmission unit and converting its voltage level into a voltage level of an inner core power and then outputting it.

18 Claims, 4 Drawing Sheets

MIXED VOLTAGE INPUT BUFFER

BACKGROUND OF THE INVENTION

1. Field of the Invention

The present invention relates to a mixed voltage input buffer.

2. Discussion of Related Art

Generally, in order to manage mixed voltage in a semiconductor device which uses various voltages, the mixed voltage input buffer provides various usefulness, namely it is used in a corresponding application field by having an optimum threshold level for respective voltages and a little power consumption. Particularly, a PCMCIA system can use such a characteristic at maximum. That is, a host adapter is internally separated into several function blocks, and the respective blocks operate independently and also use the mixed voltage independently. In a card interface part, since there is no power supply in case there is not the card, a control of various powers is required.

FIG. 1 is a circuit diagram of a conventional and general input buffer, and referring to FIG. 1, conventional art is described as follows. In FIG. 1, No. 1 is an NOR gate, No. 2 is an inverter, reference character CO is a final output value, a PAD is a connection pad, a CVDD is a core power, an NVDD indicates the highest voltage in chip. In FIG. 1 PDA is an enable signal of an input buffer and in a state like a card power off it becomes 'high' to make a transistor 660 'off', thereby the power consumption of the buffer is reduced. But, in the input buffer having the NOR gate 1 made up of MOS(metal oxide semiconductor) transistors from 660 to 663, the core power CVDD is used, therefore the power consumption in a case like the following is large. Namely, in case the voltage of the core power is higher than that of the card power, a voltage level of an input signal being inputted through the PAD is lower than that of the core power. Therefore, specially in a non-transition state the power consumption in the buffer occurs. Also, since the card power and power of the buffer receiving an input of the card are independent of each other, characteristic of the buffer sensitively operates in a fluctuation of a power supply voltage.

Conventionally, that is, power of the buffer and the input signal is independently used in non-transition state in the midst of chip's operation, thereby in case the power voltage of the buffer is higher than that of the input signal, there is problem causing current consumption.

SUMMARY OF THE INVENTION

Accordingly, the present invention is directed to a mixed voltage input buffer that substantially obviates one or more of the problems due to limitations and disadvantages of the related art.

An object of the present invention is to provide a mixed voltage input buffer capable of restraining a current consumption at maximum even in non-transition state in the midst of chip's operation, by using jointly power of a buffer and an input signal.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, in the mixed voltage input buffer for managing mixed voltage in a semiconductor device which uses various voltages it includes a transmission unit for inputting a given signal and transmitting the input signal according to an enable signal; and a voltage level conversion unit for inputting an output signal of the transmission unit and converting its voltage level into a voltage level of an inner core power then outputting.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings:

DETAILED DESCRIPTION OF PREFERRED EMBODIMENT

Reference will now be made in detail to the preferred embodiments of the present invention, examples of which are illustrated in the accompanying drawings.

Figure 2:
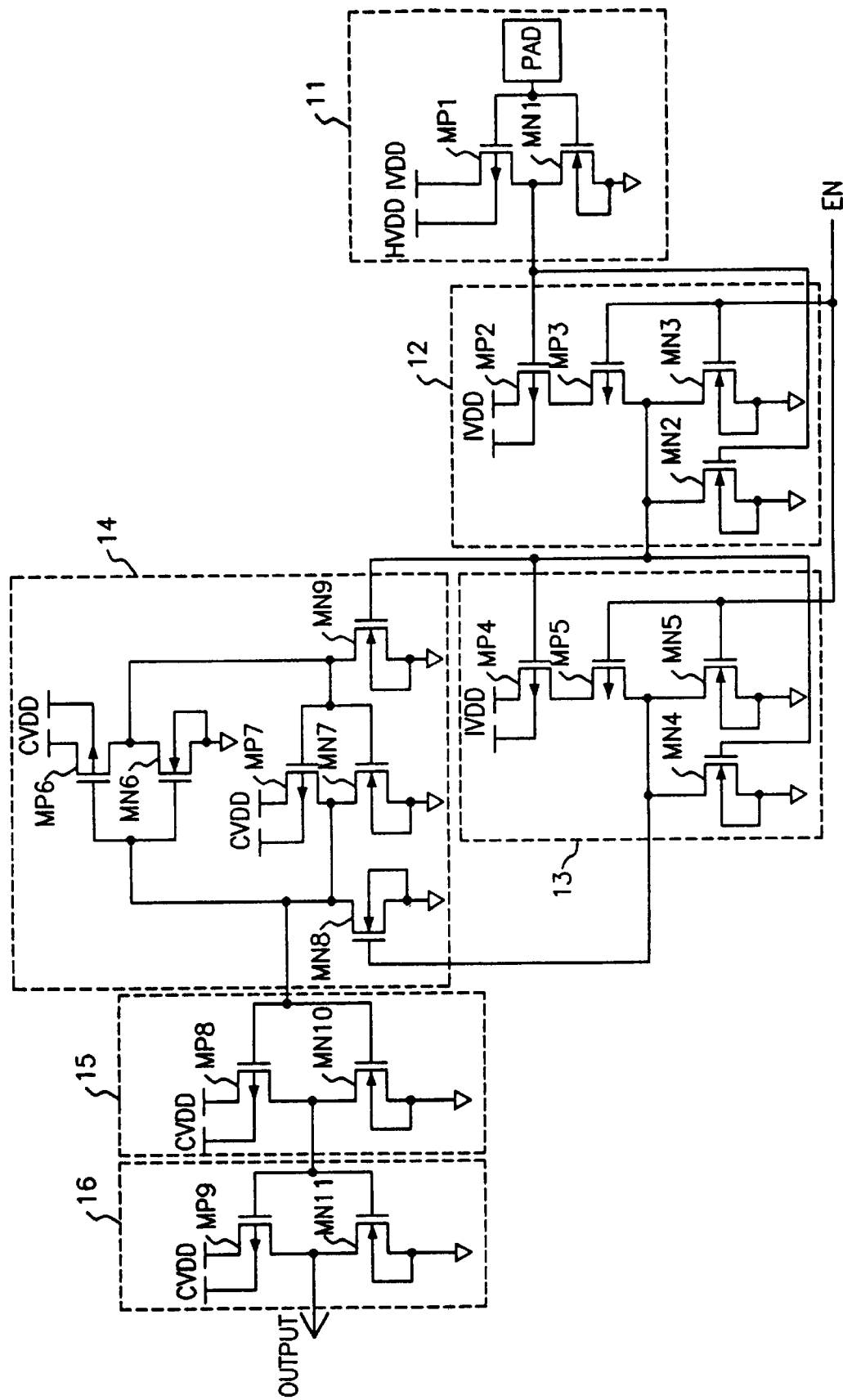
FIG. 2 is a circuit diagram of a mixed voltage input buffer according to one embodiment of the present invention.
Figure 3:
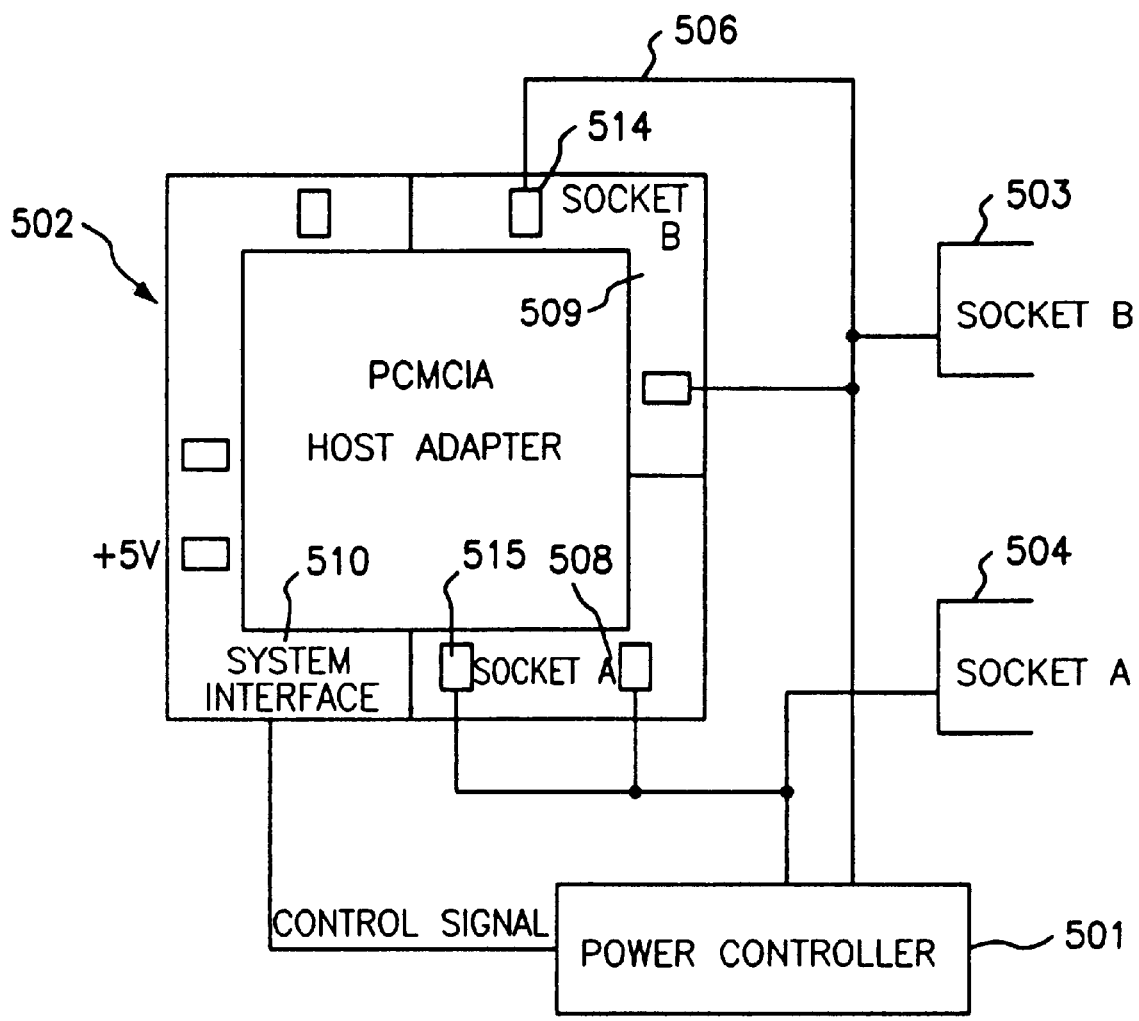
FIG. 3 is a block diagram showing a power connection of a PCMCIA system.

FIG. 2 is a circuit diagram of a mixed voltage input buffer according to one embodiment of the present invention, and FIG. 3 is a block diagram showing a power connection of a PCMCIA system, and in Figs. EN indicates an enable signal and CVDD indicates a core power. As shown in FIG. 2, the present embodiment largely includes inverters 11, 15 and 16, and NOR gates 12 and 13, and a voltage level converter 14. The inverter 11 is constructed by a pull-up PMOS transistor MP1 and a pull-down NMOS transistor MN1, and inputs a signal applied to a connection pad PAD, and fully swings it then outputs. At this time, in the input signal of TTL or CMOS levels its voltage level is converted into voltage of a corresponding power, namely IVDD, through the inverter 11, then is outputted. Herewith, a source of PMOS transistor MP1 is connected to power IVDD same as power of a part which drives oneself, and is back biased by the highest voltage HVDD within chip.

The NOR gate 12 made up of PMOS transistors MP2 and MP3 and NMOS transistors MN2 and MN3 has an output of the inverter 11 and the enable signal EN as two inputs, and at this time, power is also IVDD. The NOR gate 13 constructed by PMOS transistors MP4 and MP5 and NMOS transistors MN4 and MN5 has an output of the NOR gate 12 and the enable signal EN as two inputs, and power is also IVDD. An input part of the voltage level converter 14 made up of NMOS transistors MN and MN9 receives outputs of the NOR gates 12 and 13 through respective gates. Sources of respective NMOS transistors MN and MN9 are connected with earth terminals, and drains are connected with input and output terminals of a latch made up of PMOS transistors MP6 and MP7 and NMOS transistors MN6 and MN7. Herewith, the latch uses power of an inner core, namely CVDD, thereby the core can be driven and non-transition current consumption can be prevented in a logic of a back stage. The inverter 11 and the NOR gates 12 and 13 also use power like power of the input, thereby the non-transition current consumption can be prevented.

The inverters 15 and 16 made up of PMOS transistors MP8 and MP9 and NMOS transistors MN10 and MN11 have a drivility for driving the inner core. Herewith, as showing in FIG. 3, the IVDD is power supplied to respective blocks in respective function blocks of the inside of a PCMCIA host adapter, and in card power and in power of respective card interface the same power is used. Accordingly, since the card power and voltage of the buffer receiving a card input are same, and in the non-transition period the voltage of the input becomes the same as the voltage level of the buffer, in the inverter 11 made up of the PMOS transistor MP1 and the NMOS transistor MN1 in FIG. 2 one of two transistors becomes 'on' and the other becomes 'off' and therefore the current consumption can be prevented. Also, it is converted into the core voltage through the voltage level converter 14 which is made up of PMOS transistors MP6 and MP7 and NMOS transistors MN6, MN7, MN and MN9, and which converts voltage in case the card power and the voltage of inner core are different, therefore the current consumption can be prevented. And the enable signal EN is connected with input terminals of the NOR gates 12 and 13 made up of PMOS transistors MP2, MP3, MP4 and MP5 and NMOS transistors MN2, MN3, MN4 and MN5, thereby unnecessary power consumption is prevented.

As showing in FIG. 3, the PCMCIA host adapter 502 is made up of three parts such as a system interface 510, a socket A interface 508 and a socket B interface 509. When the card is inserted into the socket A 504 or the socket B 503, respectively and independently through the system interface a power controller 501 is controlled to supply power to the socket interface of the PCMCIA host adapter 502 and to the socket the card is inserted. Power 506 and 507 supplied from the power controller 501 are respectively supplied to a power pin 515 of the socket A and a power pin 514 of the socket B, and the respective power is connected to the respective socket.

Operations of one embodiment of the invention are described more in detail as follows. In the present embodiment, when the input signal is inputted to gates of PMOS transistor MP1 and NMOS transistor MN1, the input voltage level is converted into the voltage level of the IVDD. This converted signal is inputted to the NOR gate 12, and the output of the NOR gate 12 is also inputted to the NOR gate 13. The output of NOR gate 12 is also inputted to a gate of NMOS transistor MN9 which is one of elements making the voltage level converter 14 up. An output of NOR gate 13 is inputted to a gate of NMOS transistor MN8.

Since the input voltage of NMOS transistors MN4 and MN5 maintains an opposite level in a standard of IVDD, an opposite voltage level against voltage of the core power is maintained by the latch made up of PMOS transistors MP6 and MP7 and NMOS transistors MN6 and MN7 and connected to the core power. Accordingly, since the output of the voltage level converter 14 has an earth or CVDD levels, the inverters 15 and 16 having CVDD power are driven, and its output voltage fully swings in the standard of CVDD. Therefore, in the inverters 15 and 16 there is no current consumption in non-transition.

Above description of these all operations is for a case of 'low' of the enable signal EN, and in this case, operations of a state that maintains the above two NOR gates as the enable state were described as the above. When the enable signal EN becomes 'high', the above two NOR gates become 'off' therefore there is no the current consumption.

Figure 4:
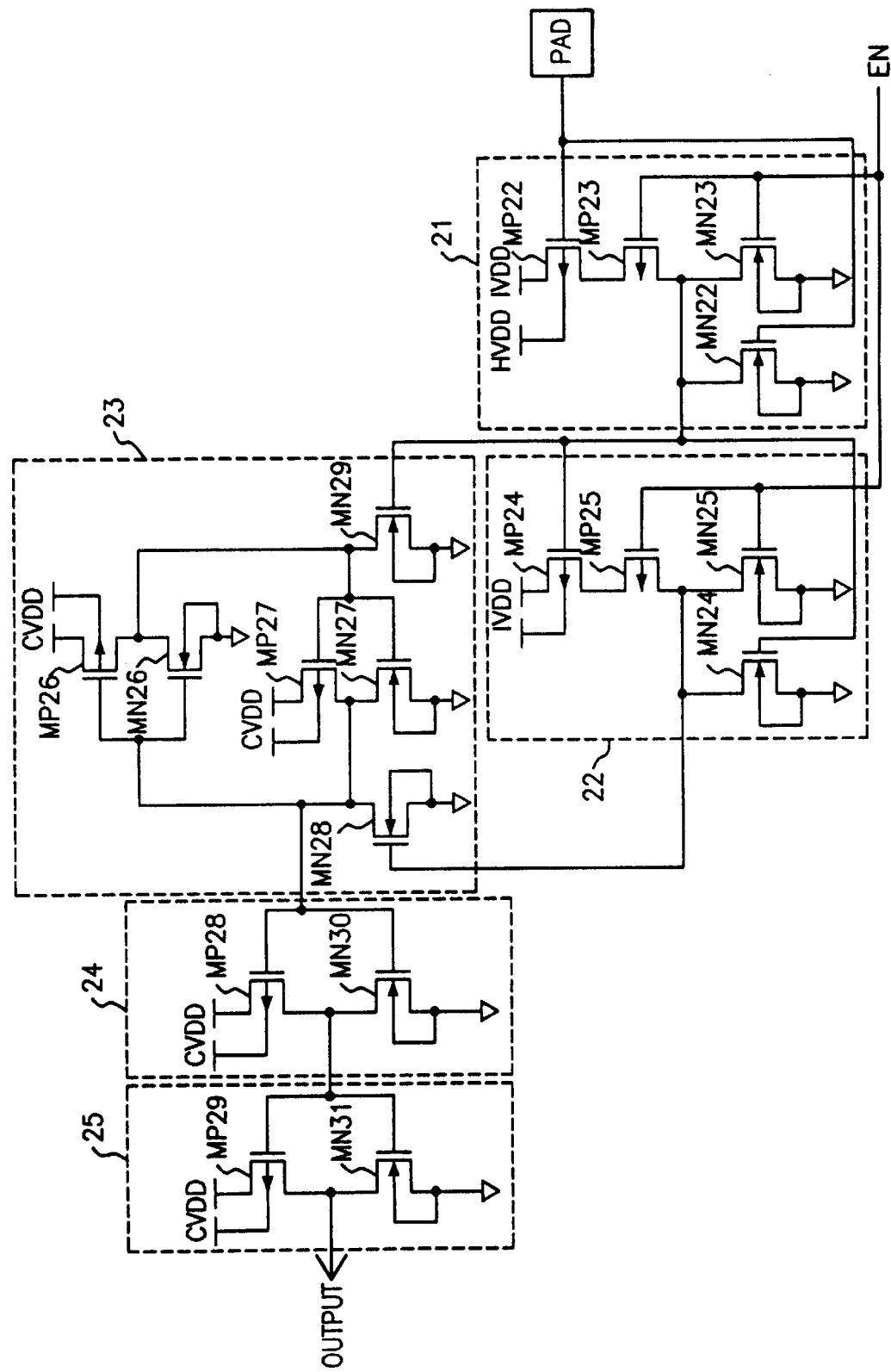
FIG. 4 is a circuit diagram of the mixed voltage input buffer according to another embodiment of the present invention.
Figure 1:
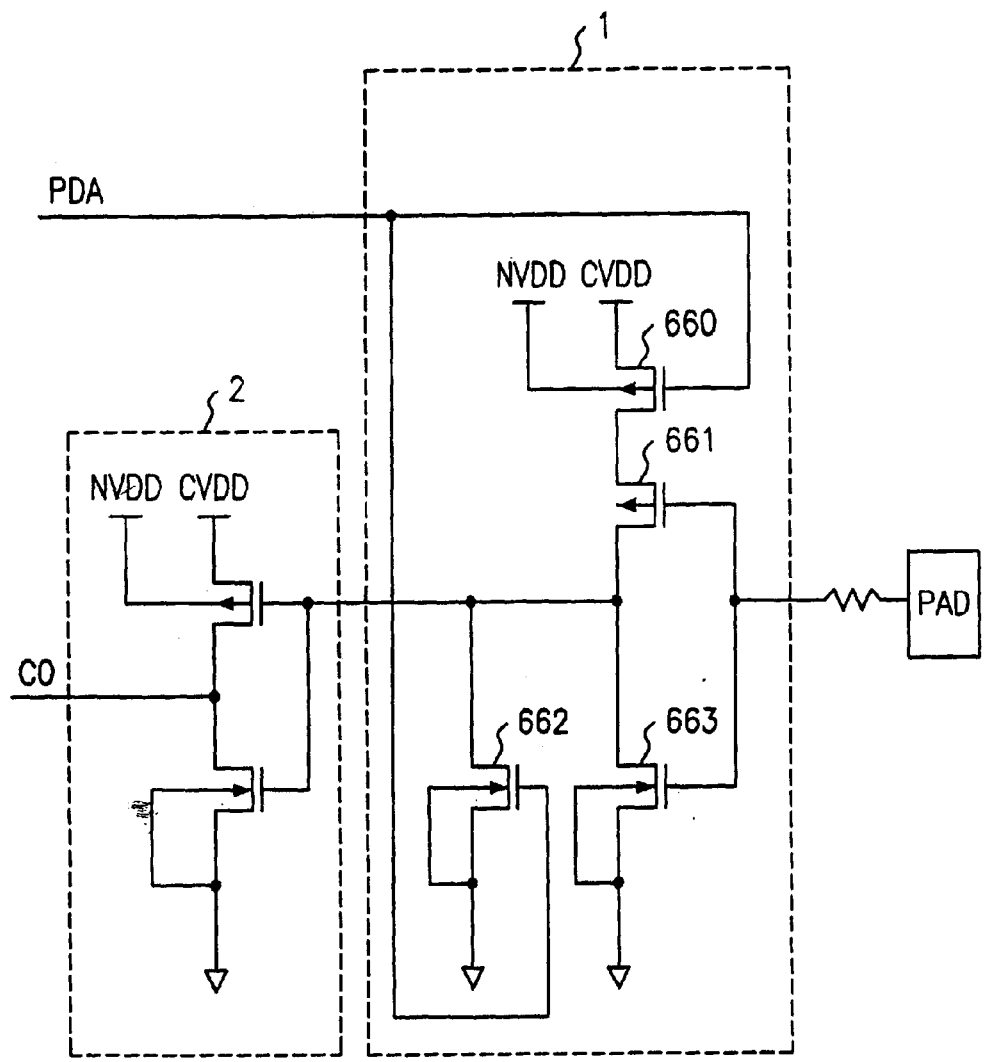

FIG. 4 is a circuit diagram of the mixed voltage input buffer according to another embodiment of the present invention. In another embodiment of the present invention, in order to prevent the current consumption in a case the input signal floats in a card power off, the input is connected directly to NOR gate 21, thereby the current consumption can be prevented. The other constructions excepting this, namely, of an NOR gate 22, a voltage level converter 23 and inverters 24 and 25, are same. At this time, the NOR gate 21 should be constructed so that the input voltage level is converted into the voltage level of IVDD. For this, as shown in FIG. 4 IVDD should be applied to a source terminal of a pull-up PMOS transistor MP22 and should be back-biased by the highest voltage HVDD within the chip.

In the PCMCIA system, in case there is not the card in the socket side and in case of a floatation, the enable signal EN becomes 'high' so that unnecessary leakage doesn't occur, thereby the NOR gates 12 and 13 are made as a disabling state.

The present invention aforementioned specific effect capable of restraining power consumption in the midst of operation at maximum. Accordingly, the present invention can be used in a system which requires low power consumption such as in a battery operated system used mainly in a notebook computer like the PCMCIA system.

It will be apparent to those skilled in the art that various modifications and variations can be made in the mixed voltage input buffer of the present invention without departing from the spirit or scope of the invention. Thus, it is intended that the present invention cover the modifications and variations of this invention provided they come within the scope of the appended claims and their equivalents.

What is claimed is:

1. A mixed voltage input buffer for managing mixed voltages in a semiconductor device which uses various voltages, comprising:
   a transmission unit supplied with an input power (IVDD) as a driving power for receiving an external signal having varying voltage levels and transmitting said received external signal according to an enable signal;
   a voltage level conversion unit for receiving said transmitted signal and converting its voltage level into a voltage level of an inner core power and then producing it; and
   a driving unit for receiving an output of said voltage level conversion unit and driving an inner core, and
      wherein said transmission unit includes:
         an inverter for receiving said external signal and performing a full swing between a voltage level of said input power and a ground and then producing it;
         a first NOR gate for receiving an output of said inverter and said enable signal as two inputs; and
         a second NOR gate for receiving an output of said first NOR gate and said enable signal as two inputs.

2. The mixed voltage input buffer as claimed in claim 1, wherein said inverter comprises a pull-up transistor whose source is coupled to said input power (IVDD) and which is back biased by the highest voltage within the semiconductor device.

3. The mixed voltage input buffer as claimed in claim 2, wherein the voltage level of said input power (IVDD) is the same as the power of an outside device to be driven.

4. The mixed voltage input buffer as claimed in claim 1, wherein said voltage level conversion unit comprises:
   a first NMOS transistor having a gate coupled to an output of said first NOR gate and a source coupled to said ground;
   a second NMOS transistor having a gate coupled to an output of said second NOR gate and a source coupled to said ground; and
   a latch having an input terminal coupled to a drain of said first NMOS transistor and an output terminal coupled to a drain of said second NMOS transistor, said latch converting a level of voltage applied to its terminals into the voltage level of said inner core power.

5. The mixed voltage input buffer as claimed in claim 4, wherein said driving unit comprises a plurality of inverters coupled in series each supplied with said inner core power as driving voltage.

6. A mixed voltage input buffer for managing mixed voltages in a semiconductor device which uses various voltages, comprising:
   a transmission unit supplied with an input power (IVDD) as a driving power for receiving an external signal having varying voltage level and transmitting said received external signal according to an enable signal;
   a voltage level conversion unit for receiving said transmitted signal and converting its voltage level into a voltage level of an inner core power and then producing it; and
   a driving unit for receiving an output of said voltage level conversion unit and driving an inner core, and
   wherein said transmission unit includes:
      a first NOR gate for receiving said received external signal and said enable signal as two inputs; and
      a second NOR gate for receiving an output of said first NOR gate and said enable signal as two inputs.

7. The mixed voltage input buffer as claimed in claim 6, wherein said first NOR gate comprises a pull-up transistor having a source coupled to said input power (IVDD) and back biased by a highest voltage within the semiconductor device.

8. The mixed voltage input buffer as claimed in claim 7, wherein said voltage level of said input power (IVDD) is the same as the power of an outside device to be driven.

9. The mixed voltage input buffer as claimed in claim 6, wherein said voltage level conversion unit comprises:
   a first NMOS transistor having a gate coupled to said output of said first NOR gate and a source coupled to a ground;
   a second NMOS transistor having a gate coupled to said output of said second NOR gate and a source coupled to said ground; and
   a latch having an input terminal coupled to a drain of said first NMOS transistor and an output terminal coupled to a drain of said second NMOS transistor, said latch converting a level of voltage applied to its terminals into said voltage level of said inner core power.

10. The mixed voltage input buffer as claimed in claim 9, wherein said driving unit comprises a plurality of inverters coupled in series each supplied with said inner core power as driving voltage.

11. A mixed voltage input buffer for managing mixed voltages in a semiconductor device which uses various voltages, comprising:
   a transmission unit supplied with an input power (IVDD) as a driving power for receiving an external signal having varying voltage levels and transmitting said received external signal according to an enable signal; and
   a voltage level conversion unit for receiving said transmitted signal and converting its voltage level into a voltage level of an inner core power and then producing it, and
   wherein said transmission unit includes:
      an inverter for receiving said external signal and performing a full swing between a voltage level of said input power and a ground and then producing it;
      a first NOR gate for receiving an output of said inverter and said enable signal as two inputs; and
      a second NOR gate for receiving an output of said first NOR gate and said enable signal as two inputs.

12. The mixed voltage input buffer as claimed in claim 11, wherein said inverter comprises a pull-up transistor whose source is coupled to said input power (IVDD) and which is back biased by the highest voltage within the semiconductor device.

13. The mixed voltage input buffer as claimed in claim 12, wherein the voltage level of said input power (IVDD) is the same as the power of an outside device to be driven.

14. The mixed voltage input buffer as claimed in claim 11, wherein said voltage level conversion unit comprises:
   a first NMOS transistor having a gate coupled to an output of said first NOR gate and a source coupled to said ground;
   a second NMOS transistor having a gate coupled to an output of said second NOR gate and a source coupled to said ground; and
   a latch having an input terminal coupled to a drain of said first NMOS transistor and an output terminal coupled to a drain of said second NMOS transistor, said latch converting a level of voltage applied to its terminals into the voltage level of said inner core power.

15. A mixed voltage input buffer for managing mixed voltages in a semiconductor device which uses various voltages, comprising:
   a transmission unit supplied with an input power (IVDD) as a driving power for receiving an external signal having varying voltage level and transmitting said received external signal according to an enable signal;
   a voltage level conversion unit for receiving said transmitted signal and converting its voltage level into a voltage level of an inner core power and then producing it, and
   wherein said transmission unit having:
      a first NOR gate for receiving said received external signal and said enable signal as two inputs; and
      a second NOR gate for receiving an output of said first NOR gate and said enable signal as two inputs.

16. The mixed voltage input buffer as claimed in claim 15, wherein said first NOR gate comprises a pull-up transistor having a source coupled to said input power (IVDD) and back biased by a highest voltage within the semiconductor device.

17. The mixed voltage input buffer as claimed in claim 16, wherein said voltage level of said input power (IVDD) is the same as the power of an outside device to be driven.

18. The mixed voltage input buffer as claimed in claim 15, wherein said voltage level conversion unit comprises:
   a first NMOS transistor having a gate coupled to said output of said first NOR gate and a source coupled to a ground;

a second NMOS transistor having a gate coupled to said output of said second NOR gate and a source being coupled to said ground; and a latch having an input terminal coupled to a drain of said first NMOS transistor and an output terminal coupled to a drain of said second NMOS transistor, said latch converting a level of voltage applied to its terminals into said voltage level of said inner core power.

* * * * *

UNITED STATES PATENT AND TRADEMARK OFFICE
CERTIFICATE OF CORRECTION

PATENT NO.    : 5,917,339
DATED         : June 29, 1999
INVENTOR(S)   : Kim

It is certified that error appears in the above-identified patent and that said Letters Patent is hereby corrected as shown below:

Title page,
Item [73], delete "Hyundai Elecronics" and insert -- Hyundai Electronics --.

Column 2,
Line 64, delete "transistors MN and MN9" and insert -- transistors MN8 and MN9 --.
Line 66, delete "transistors MN and MN9" and insert -- transistors MN8 and MN9 --.

Column 3,
Line 17, delete "are same" and insert -- are the same --.
Line 26, delete "MN and MN9" and insert -- MN8 and MN9 --.

Column 4,
Line 18, delete the blank line between the words *in* and *Fig. 4*, making them one paragraph.

Signed and Sealed this

Twenty-seventh Day of August, 2002

Attest:

JAMES E. ROGAN
Attesting Officer     Director of the United States Patent and Trademark Office

UNITED STATES PATENT AND TRADEMARK OFFICE
CERTIFICATE OF CORRECTION

PATENT NO.   : 5,917,339
DATED        : June 29, 1999
INVENTOR(S)  : Kim

Figure 1:
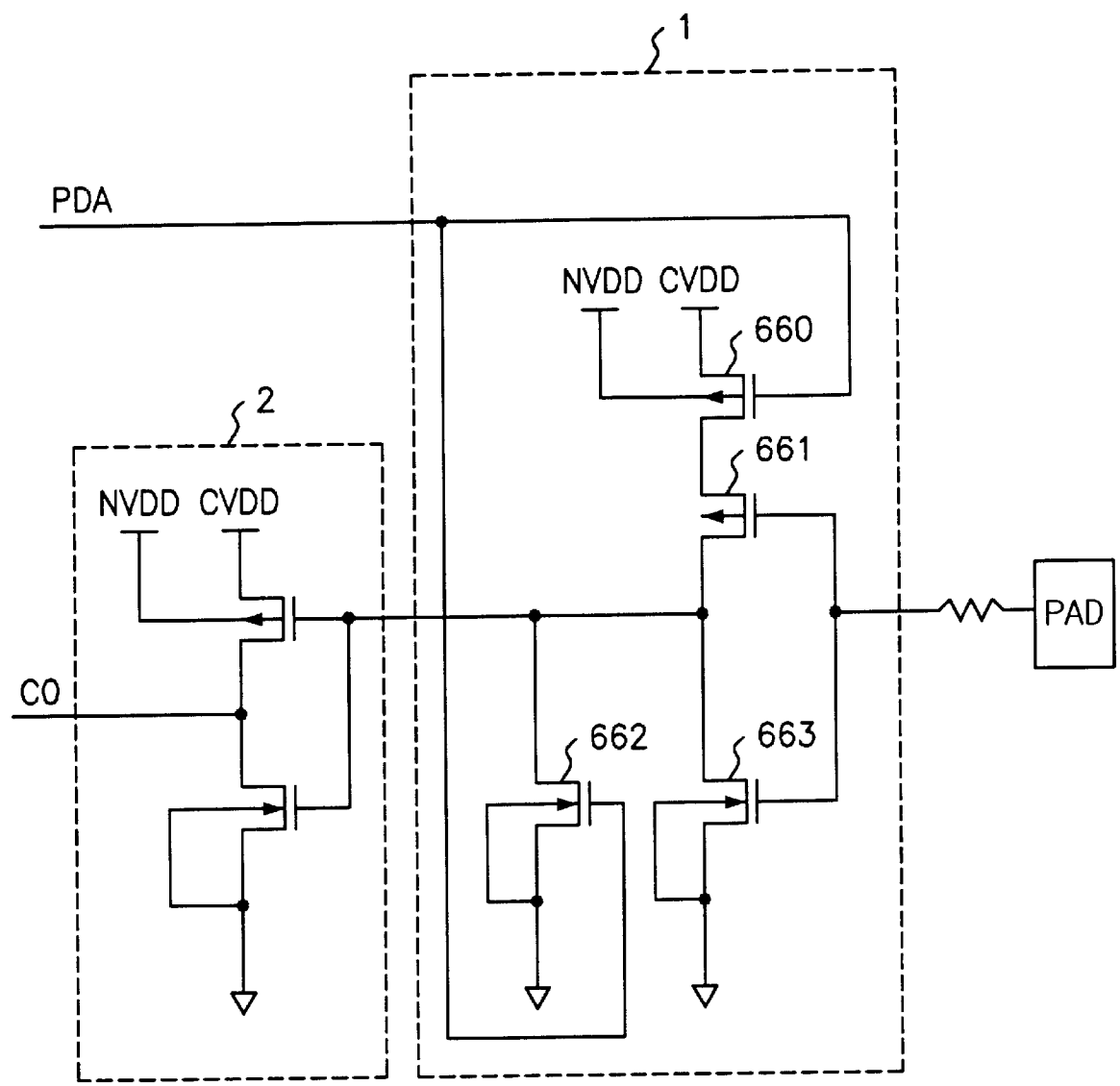
FIG. 1 is a circuit diagram of a conventional and general input buffer.

It is certified that error appears in the above-identified patent and that said Letters Patent is hereby corrected as shown below:

<u>Drawings,</u>
Figure 1, please insert -- (Prior Art) -- as shown on the attached sheet.

Signed and Sealed this

Twenty-second Day of April, 2003

JAMES E. ROGAN
*Director of the United States Patent and Trademark Office*